United States Patent
Smith et al.

(10) Patent No.: US 7,026,251 B2
(45) Date of Patent: Apr. 11, 2006

(54) METHOD OF OPTIMIZED STITCHING FOR DIGITAL MICRO-MIRROR DEVICE

(75) Inventors: Jack C. Smith, Parker, TX (US);
James D. Huffman, Cambridge (GB)

(73) Assignee: Texas Instruments Incorporated, Dallas, TX (US)

( * ) Notice: Subject to any disclaimer, the term of this patent is extended or adjusted under 35 U.S.C. 154(b) by 302 days.

(21) Appl. No.: 10/317,330

(22) Filed: Dec. 12, 2002

(65) Prior Publication Data

US 2003/0108148 A1    Jun. 12, 2003

Related U.S. Application Data

(60) Provisional application No. 60/339,760, filed on Dec. 12, 2001.

(51) Int. Cl.
*H01L 21/302*    (2006.01)
(52) U.S. Cl. .......................... 438/708; 438/725; 430/30
(58) Field of Classification Search ................ 438/710, 438/725, 708; 430/5, 30
See application file for complete search history.

(56) References Cited

U.S. PATENT DOCUMENTS

| | | | | |
|---|---|---|---|---|
| 5,825,194 | A * | 10/1998 | Bhuva et al. | 324/763 |
| 6,194,105 | B1 * | 2/2001 | Shacham et al. | 430/5 |
| 6,541,165 | B1 * | 4/2003 | Pierrat | 430/5 |

* cited by examiner

*Primary Examiner*—Nadine G. Norton
*Assistant Examiner*—Binh X. Tran
(74) *Attorney, Agent, or Firm*—Charles A. Brill; Wade James Brady, III; Frederick J. Telecky, Jr.

(57) ABSTRACT

A method of providing a reticle layout for a die having at least three patterns, namely a right pattern, a center pattern, and a left pattern, where the center pattern is oversized relative to the photolithography step size. To avoid the non-uniformity effects resulting from stitching the center pattern, the center pattern size is minimized. This is accomplished by moving portions of the center pattern to the left and right patterns.

10 Claims, 3 Drawing Sheets

METHOD OF OPTIMIZED STITCHING FOR DIGITAL MICRO-MIRROR DEVICE

This application claims priority under 35 USC § 119(e)(1) of provisional application No. 60/339,760 filed Dec. 12, 2001.

TECHNICAL FIELD OF THE INVENTION

This invention relates to semiconductor fabrication, and more particularly to a method of reducing the effects of non-uniformity in stitched patterns of an integrated circuit.

BACKGROUND OF THE INVENTION

Almost all of today's computer chips are built on silicon wafers. Semiconductor manufacturers produce many kinds of ICs or chips. The precise process followed to make a chip varies according to the type of chip and the manufacturing company. However most wafer processing involves the same basic steps.

FIG. 1 illustrates the exposure phase of the photolithography process that occurs during fabrication of an integrated circuit (or "chip"). Photolithography is used to create layers of circuit patterns on the chip. First, the wafer is coated with a light-sensitive material called photoresist. Light is shown through patterned plate called a reticle (or "mask") to expose the resist, much the same way as film is exposed to light to form a photographic image. Following the lithographic process, the wafer is etched so that materials are removed, thus forming a three-dimensional pattern on the surface of the chip. Through additional lithographic and etching steps, subsequent layers of various patterned materials are built up on the wafer to form the multiple layers of circuit patterns on the chip.

Once wafer processing is complete, each chip (or die) on the wafer is tested for electrical performance, cut apart with wafer saws, and put into individual protective packages. Once packaged, chips are tested again to make sure they function properly before being shipped to distributors or placed in electronic products It sometimes occurs that a single pattern is larger than the field size of the photolithographic stepper. When this occurs, the pattern is subdivided and the patterns are "stitched" to form the original pattern. If there are non-uniformities existing across the exposure field of the photolithographic stepper, then these non-uniformities may show up as discontinuities across the stitch.

SUMMARY OF THE INVENTION

One aspect of the invention is a method of laying out a photolithography reticle for a layer of a semiconductor die, the layer having at least three patterns to be stitched in series, that is, a first end pattern, a center pattern, and a second end pattern. It is first determined whether the step size of the photolithography equipment is smaller than a pattern to be printed. If so, then stitching must be employed. To optimize stitching so as to reduce the effects of non-uniformities, the center pattern is made smaller by moving portions of the center pattern to the first end pattern and to the second end pattern.

An advantage of the invention is that it minimizes non-uniformity effects resulting from stitching the center pattern. It avoids the "worst case" situation, in which non uniformities meet in the middle of the stitched (composite) die.

In the case of a die used to make an image-generating array, such as a digital micro-mirror device, non uniformity effects resulting from stitching can result in visible differences at the stitch line. When the patterns are adjusted as described above, these visible effects are minimized.

DETAILED DESCRIPTION OF THE INVENTION

Figure 1:
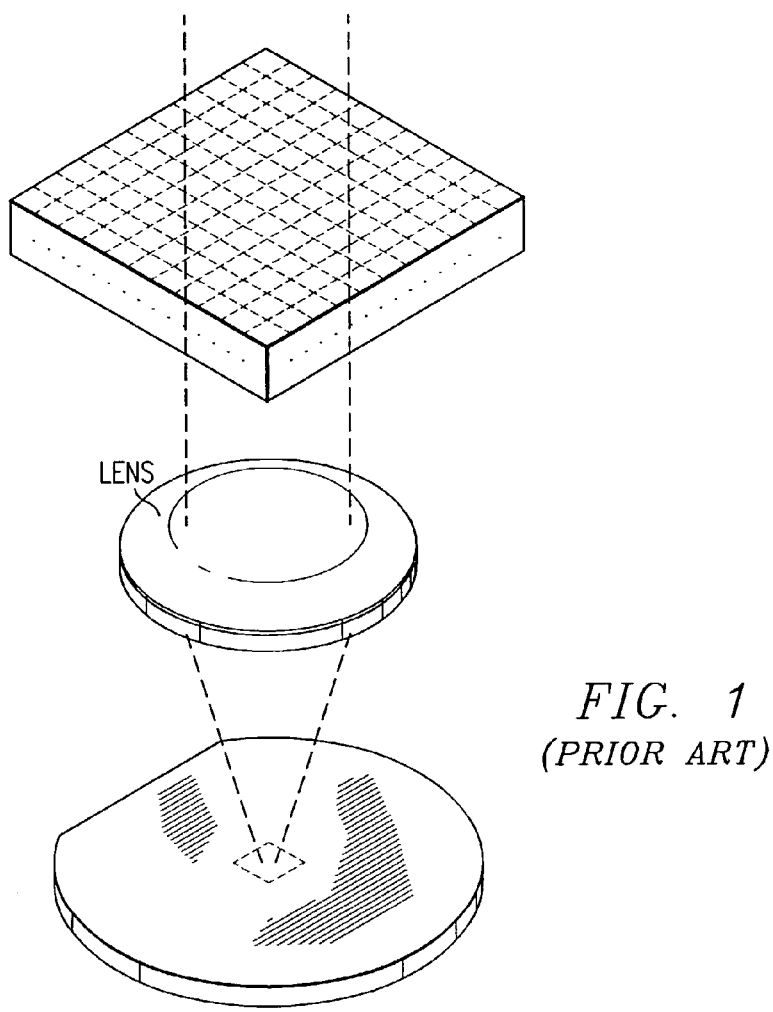
FIG. 1 illustrates how a reticle is used to expose a die for a semiconductor device.
Figure 2:
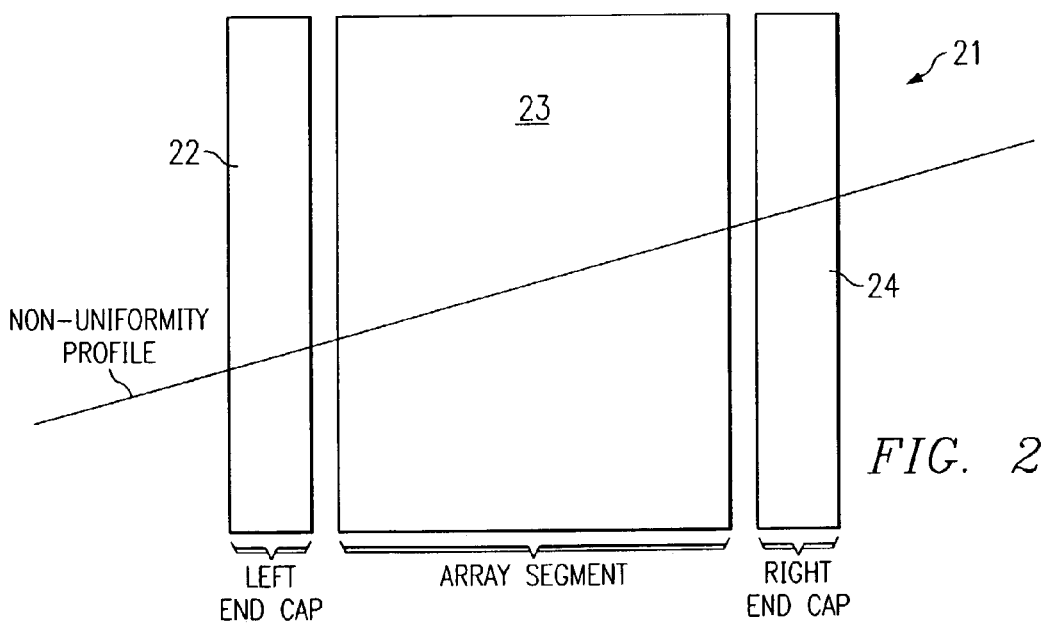
FIG. 2 illustrates a conventional reticle layout and a non uniformity profile across the patterns of the reticle.

FIG. 2 illustrates an example of a reticle layout 21, having three different patterns for a single die. The patterns are identified as the left end cap 22, the center segment 23, and the right end cap 24.

Figure 2A:
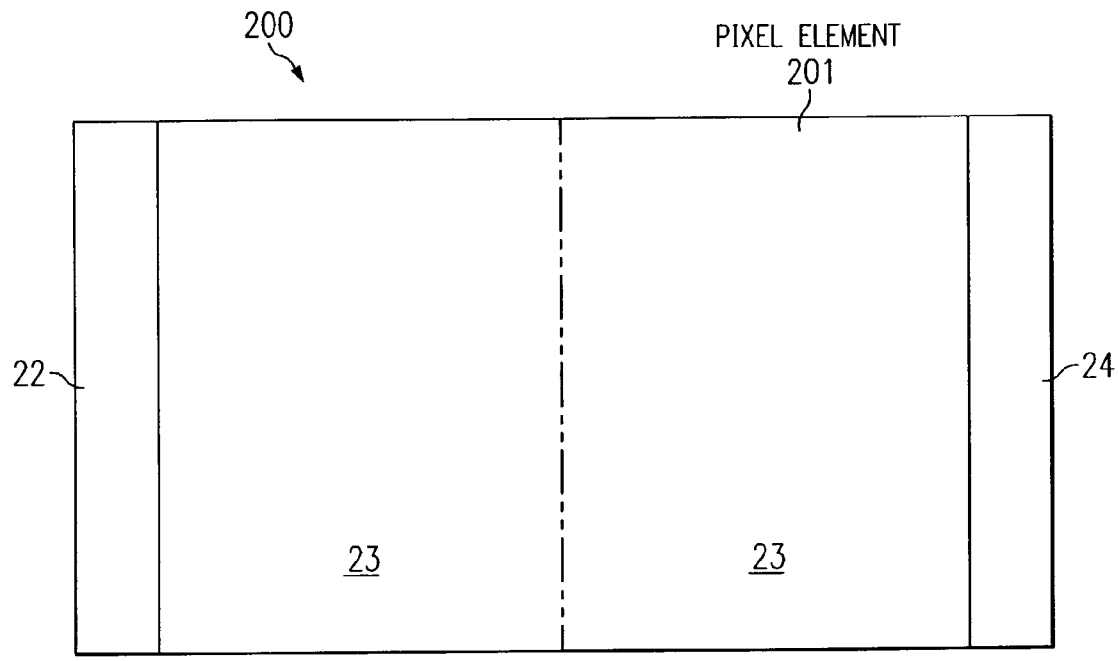
FIG. 2A illustrates an example of a semiconductor device made from a pattern like that of FIG. 2.

FIG. 2A illustrates an example of a device 200 that may be made using patterns like that of FIG. 2, namely a digital micro-mirror device (DMD), manufactured by Texas Instruments Incorporated. The DMD is constructed with a pixel array in the center of the device and electronic circuitry at the left and right edges (periphery) of the device. The pixel array has hundreds or thousands of micro-mirror elements, each individually addressable, which are typically used to form images for display applications. The periphery circuitry is used to input power, load memory, and sequence the data for proper operation of the DMD.

Relating the patterns of FIG. 2 to the DMD 200 of FIG. 2A, the end caps 22 and 24 are used to make the peripheral circuitry. One or more center segments 23 are used to make the pixel array.

For a large DMD, stitching is used to increase the size of the center array. In the example of FIG. 2, the center segment 23 has been printed twice. The two center segments are "stitched" where they meet to result in a contiguous array pattern. This process of printing two patterns is typically performed because the enlarged array size makes the device larger than the field size of the photolithography equipment.

Referring again to FIG. 2, the diagonal line across the three patterns 22, 23, and 24 illustrates an across-the-field non uniformity profile. In the case of DMD 200, an example of a non-uniformity effect is a left-to-right difference in brightness in an image produced by the array.

Analogous non-uniformity problems might exist in integrated circuits other than a DMD. In general, an integrated circuit having a central array of like elements might have non-uniformity problems when the central array is sufficiently large so as to call for stitching. Brightness discontinuity is but one example of a non-uniformity effect resulting from stitching. Depending on the type of center array, different types of non-uniformity effects other than those involving brightness levels might occur.

Figure 3:
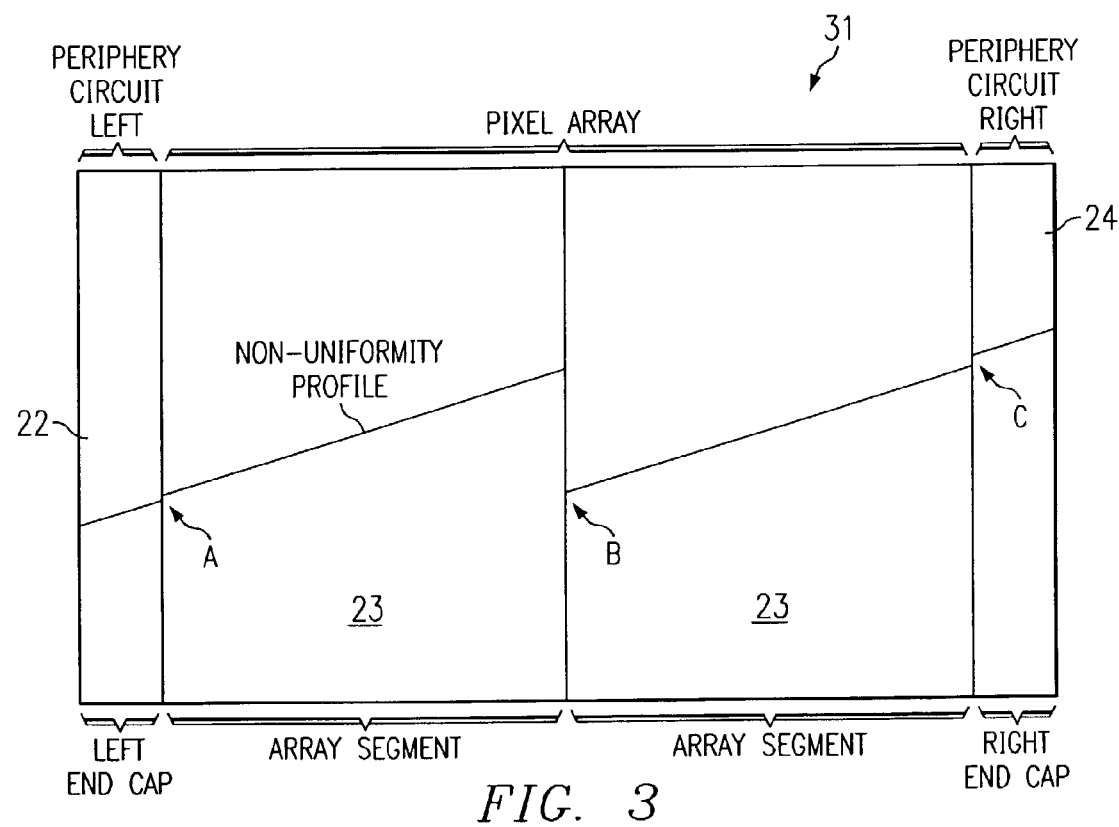
FIG. 3 illustrates the composite die made from the layout of FIG. 2.

FIG. 3 illustrates a layer of a composite die 31 made by stitching the patterns of FIG. 2. This device exceeds the stepper field size, and therefore array stitching (comprising two center patterns 23), is required to print the full array. Relative to the stepper field size, the main pattern can be said to be "oversized". To create the desired pattern, the center pattern 23 has been printed twice with adjoining edges butted against each other. In other words, four exposures were performed, one each for the end caps 22 and 24 and two for the center array segments 23.

FIG. 3 further illustrates the effects of left-to-right non-uniformity, using the non-uniformity profile illustrated in FIG. 2. As shown, the two stitches between the end caps 22 and 24 and the center segment 23 result in small discontinuities, identified at points A and C on the non-uniformity profile. However, the stitch between the two array segments 23 results in a large discontinuity, identified at point B. In the case of a DMD 200, this type of discontinuity may have adverse effects on the images produced by the array.

Figure 4:
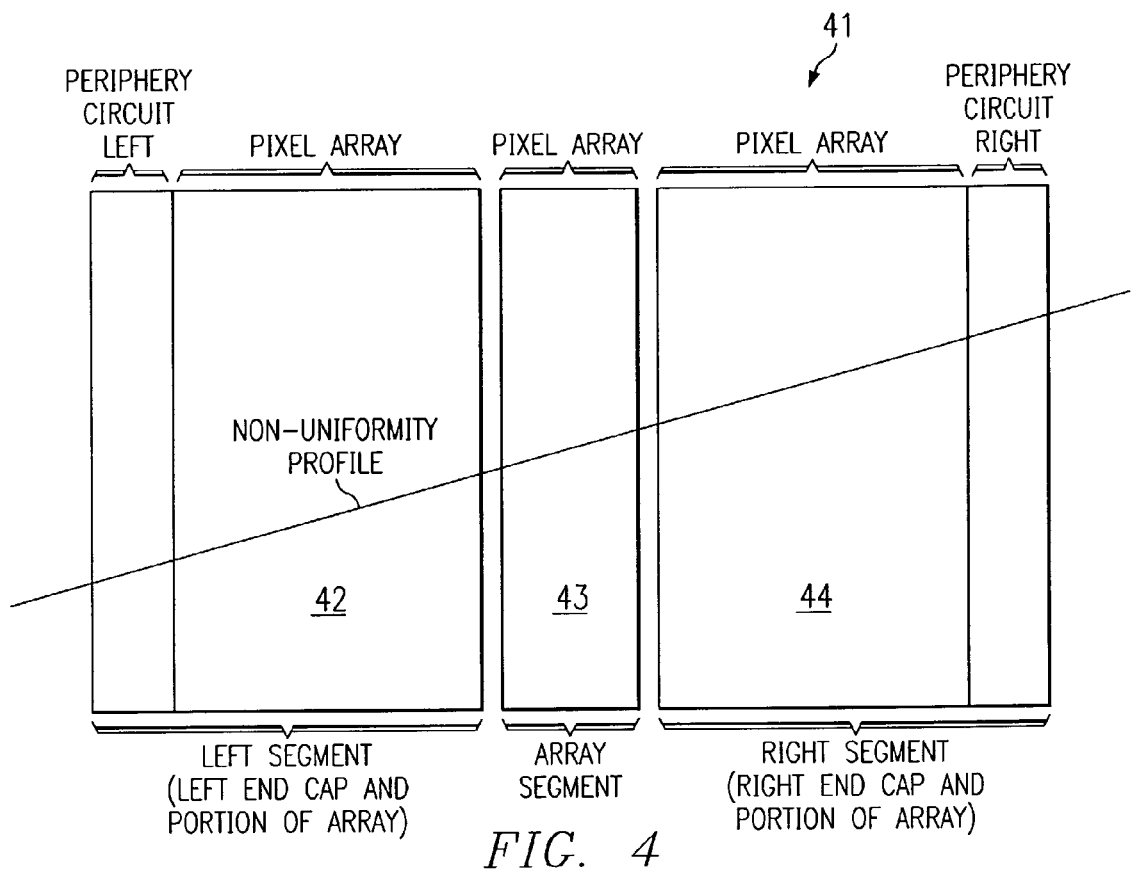
FIG. 4 illustrates an improved layout for the same patterns as the layout of FIG. 2 but re-arranged to minimize non-uniformity effects.

FIG. 4 illustrates an alternative reticle layout 41 for fabricating the same chip layer as the reticle 21. As illustrated, the size of the center segment pattern 43 is small relative to the center segment 23 of FIG. 2. To achieve the reduction in the size of the center segment 43, the left end cap pattern 22 has been combined with a portion of the center segment 23 to form a left end pattern 42, thereby reducing the size of the center array segment 43. Likewise, the right end cap pattern 24 has been combined with a portion of the center segment 23 to form a right end pattern 44. The result is a center pattern 43 that is substantially smaller than pattern 23. This rearrangement of the patterns reduces the non-uniformity effects of having very large center pattern. The diagonal line represents the same non-uniformity profile as illustrated in FIG. 2.

Figure 5:
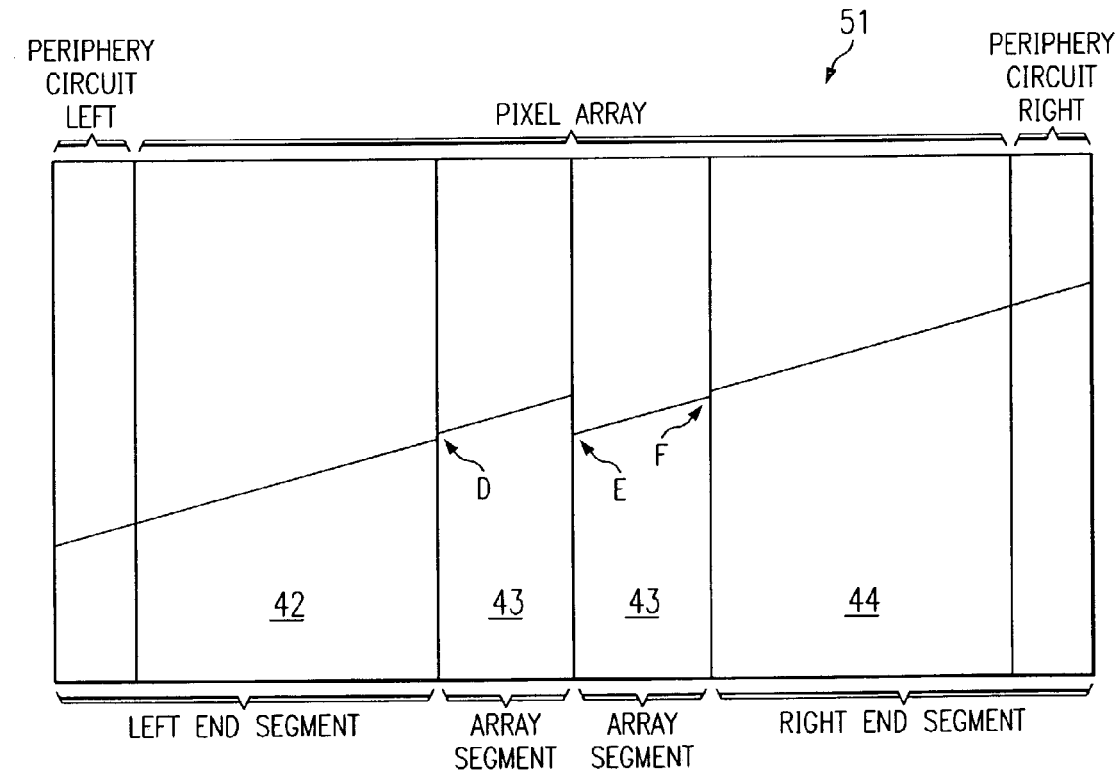
FIG. 5 illustrates the composite die made from the layout of FIG. 4.

FIG. 5 illustrates the stitched die 51 resulting from the reticle 41 of FIG. 4. Again, four exposures were performed. However, as illustrated in the example of FIG. 5, the portions of the composite center pattern made from the two center segments 43 are smaller than the portions moved to the left and right patterns 42 and 44.

Ideally, the center pattern 43 is made as small as possible, given the constraints of the overall die size and the allowable field size of the stepper. The remaining (minimized) center pattern 43 may be, but is not necessarily, smaller than the portions of the center pattern moved to the end segments 42 and 44.

FIG. 5 further illustrates how the layout 41 and the stitching of the patterns comprising layout 41 result in reduction of non-uniformity effects. The discontinuities at the stitches are small and less noticeable in the images produced by the array. Overall, the left to right non-uniformity is less abrupt and relatively continuous. Thus, although the array now has three stitches rather than one, the discontinuities at the stitch lines are smaller.

It should be understood that the same concepts equivalently apply to a die having a series of top-to-bottom patterns rather than a series of left-to-right patterns. In this case, the improved reticle layout could be used to reduce the effect of top-to-bottom discontinuities. In other words, the concepts described herein are applicable regardless of whether the patterns are to be stitched vertically or horizontally.

In general, the invention is applicable when the resulting die is to be comprised of a series of at least three adjoining patterns with a central "oversized" pattern. An example of other devices in which the reticle layout may be improved according to the present invention are devices other than DMD's that are used to generate images, such as LCD arrays.

OTHER EMBODIMENTS

Although the present invention has been described in detail, it should be understood that various changes, substitutions, and alterations can be made hereto without departing from the spirit and scope of the invention as defined by the appended claims.

What is claimed is:

1. A method of laying out a photolithography reticle for a layer of a semiconductor die, the layer having at least three patterns to be stitched in series, that is, a first end pattern, a center pattern, and a second end pattern, the method comprising the steps of:

determining the step size of the photolithography equipment;

determining whether the center pattern is oversized relative to the step size; and responsive to determining that the center pattern is oversized, forming a first reticle end portion including a portion of the center pattern and the first end pattern, a central reticle portion including a portion of the center pattern, and a second reticle end portion including a portion of the center pattern and the second end pattern.

2. The method of claim 1, wherein the patterns are patterns of an image generating device.

3. The method of claim 1, wherein the center pattern represents an array of similarly shaped elements.

4. The method of claim 1, wherein the end patterns are for peripheral circuitry for controlling elements represented by the center pattern.

5. The method of claim 1, wherein the patterns are to be stitched vertically.

6. The method of claim 1, wherein the patterns are to be stitched horizontally.

7. The method of claim 1, wherein the portion of the center pattern included in the central reticle portion is smaller than the portions of the center pattern included in the first and second reticle end portions.

8. The method of claim 1, wherein the portion of the center pattern included in the central reticle portion is as small as possible given a die size and stepper field size.

9. The method of claim 1, wherein the patterns are patterns of a digital micro-mirror device.

10. The method of claim 9, wherein in the center pattern represents an array of micro-mirror elements and the end patterns represent peripheral circuitry for controlling the micro-mirror elements.

* * * * *